(12) United States Patent
Pant et al.

(10) Patent No.: US 7,839,129 B2
(45) Date of Patent: Nov. 23, 2010

(54) ON-CHIP POWER SUPPLY VOLTAGE REGULATION

(75) Inventors: Sanjay Pant, Fort Collins, CO (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 208 days.

(21) Appl. No.: 12/000,090

(22) Filed: Dec. 7, 2007

(65) Prior Publication Data

US 2009/0066162 A1 Mar. 12, 2009

Related U.S. Application Data

(60) Provisional application No. 60/993,112, filed on Sep. 10, 2007.

(51) Int. Cl.
*G05F 1/00* (2006.01)
(52) U.S. Cl. ....................... 323/271
(58) Field of Classification Search ............ 323/234, 323/265, 266, 272, 273, 282, 351, 271; 307/80, 307/86
See application file for complete search history.

(56) References Cited

U.S. PATENT DOCUMENTS

| | | | | |
|---|---|---|---|---|
| 5,001,623 | A * | 3/1991 | Magid ................... | 363/143 |
| 5,939,868 | A * | 8/1999 | Hall et al. ............. | 323/281 |
| 5,955,871 | A * | 9/1999 | Nguyen ................. | 323/282 |
| 5,982,161 | A * | 11/1999 | Nguyen et al. ......... | 323/284 |
| 6,020,729 | A * | 2/2000 | Stratakos et al. ....... | 323/283 |
| 6,271,651 | B1 * | 8/2001 | Stratakos et al. ....... | 323/282 |
| 6,400,579 | B2 * | 6/2002 | Cuk ..................... | 363/16 |
| 6,479,974 | B2 * | 11/2002 | Cohn et al. ............. | 323/312 |
| 6,674,270 | B2 * | 1/2004 | Sakamoto ............... | 323/272 |
| 6,713,992 | B2 * | 3/2004 | Matsuo et al. .......... | 323/266 |
| 6,934,171 | B2 * | 8/2005 | Dillon et al. .......... | 363/147 |
| 7,075,276 | B2 * | 7/2006 | Morales ................. | 323/246 |
| 7,576,521 | B2 * | 8/2009 | Komiya ................. | 323/268 |

(Continued)

OTHER PUBLICATIONS

Nakamura et al.: "An On-Chip Noise Canceller with High Voltage Supply Lines for Nanosecond-Range Power Supply Noise," Symp. VLSI Circuits, pp. 124-125, 2007.

(Continued)

*Primary Examiner*—Adolf Berhane
*Assistant Examiner*—Yemane Mehari
(74) *Attorney, Agent, or Firm*—Nixon & Vanderhye P.C.

(57) ABSTRACT

An integrated circuit (100) is provided with power regulating circuitry (104) serving to actively regulate the voltage difference between a first power supply rail $V_{dd}$ and a second power rail $V_{ss}$ being used to supply electrical power to processing circuitry (102). A voltage regulating capacitor $C_a$ has one terminal connected to the first power rail $V_{dd}$ and a second terminal selectively connected to either the second power rail $V_{ss}$ or a third power rail $V_{dda}$. Should a voltage undershoot be detected by voltage sensing circuitry 106, then the capacitor $C_a$ is connected to the third power rail $V_{dda}$ so as to dump at least part of charge $C_a$, $V_{dda}$ in capacitor $C_a$ onto the first power rail $V_{dd}$ and resist the voltage drop. During normal operation, charge is accumulated into the capacitor $C_a$. An additional load device $T_2$ is provided to lower the voltage difference should an overshoot be detected.

9 Claims, 13 Drawing Sheets

U.S. PATENT DOCUMENTS

| | | | |
|---|---|---|---|
| 7,626,445 B2* | 12/2009 | Lesso et al. | 327/536 |
| 2003/0178978 A1* | 9/2003 | Biagi et al. | 323/282 |
| 2009/0066162 A1* | 3/2009 | Pant et al. | 307/80 |

OTHER PUBLICATIONS

Nagata et al.: "A Built-in Technique for Probing Power Supply and Ground Noise Distribution Within Large-Scale Digital Integrated Circuits," IEEE J. Solid-State Circuits, vol. 40, No. 4, pp. 813-819, Apr. 2005.

Ang et al.: "An On-Chip Voltage Regulator Using Switched Decoupling Capacitors," ISSCC Dig. Tech. Papers, pp. 438-439, 2000.

Xu et al.: "On-Die Supply-Resonance Suppression Using Band-Limited Active Damping," ISCC Dig. Tech. Papers, pp. 268-269, 2007.

* cited by examiner

ON-CHIP POWER SUPPLY VOLTAGE REGULATION

This application claims priority to U.S. Provisional Application No. 60/993,112 filed Sep. 10, 2007, the entire contents of which are hereby incorporated by reference.

BACKGROUND OF THE INVENTION

1. Field of the Invention

This invention relates to the field of integrated circuits. More particularly, this invention relates to on-chip mechanisms for regulating the power supply voltage of an integrated circuit.

2. Description of the Prior Art

The use of increasingly small process geometries and increasingly rapid clock frequencies have exacerbated the inductive (Ldi/dt) supply noise within integrated circuits. This impacts the robustness of power supply delivery networks. Inductive supply noise is further aggravated by otherwise desirable power reduction techniques, such as power/clock-gating and frequency-stepping in dynamic voltage scaling systems. On-chip passive decoupling capacitance, which has traditionally been used for suppressing inductive supply noise, has become increasingly disadvantageous due to its area and leakage power overhead. As a result, several circuit techniques have been proposed to actively regulate the power supply against sudden surges in load/current. These proposed techniques suffer from various disadvantages, such as delivering a limited charge, being suited only for resonance suppression or requiring an additional high voltage supply. Examples of these techniques can be found in Ang et al., "An on-chip voltage regulator using switched decoupling capacitors," ISSCC Dig. Tech. Papers, pp. 438-439,2000, Xu et al.; "On-die supply-resonance suppression using band-limited active damping" ISCC Dig. Tech. Papers, pp. 268-269, 2007; and Nakamura et al., "An on-chip noise canceller with high voltage supply lines for nanosecond-range power supply noise," Symp. VLSI Circuits, pp. 124-125, 2007.

SUMMARY OF THE INVENTION

Viewed from one aspect the present invention provides an integrated circuit comprising:

processing circuitry;

a first power supply rail and a second power supply rail respectively coupled to said processing circuitry, electrical power at a power supply voltage difference being supplied to said processing circuitry via said first power supply rail and said second power supply rail; and voltage regulating circuitry coupled to said first power supply rail and said second power supply rail to regulate said power supply voltage difference; wherein said voltage regulating circuitry comprises:

a supply regulating capacitor having a first terminal coupled to said first power supply rail and a second terminal;

switching circuitry coupled to said second terminal, said second power supply rail and a third power supply rail so as to selectively couple said second terminal to one of said second power supply rail and said third power supply rail such that:

(i) when said second terminal is coupled to said second power supply rail, charge accumulates within said capacitor; and, (ii) when said second terminal is coupled to said third power supply rail, said charge accumulated within said capacitor is supplied to said first power supply rail; and voltage difference sensing circuitry coupled to said first power supply rail and said second power supply rail to sense said power supply voltage difference, said voltage difference sensing circuitry being responsive to said power supply voltage difference falling below an undershoot threshold level to control said switching circuitry to couple said second terminal to said third power supply rail so as to regulate said power supply voltage difference against undershoot.

The present technique provides an active circuit which detects and suppresses beyond-threshold supply voltage undershoots and overshoots caused due to large current transients, as well as due to current excitation at resonant frequencies. Charge accumulated within the supply regulating capacitor is at least partially pumped into the power grid during an undershoot event. This capacitor is charged at the nominal voltage of the circuit thereby obviating the need for any high-voltage supply and facilitating the usage of decoupling capacitors and switching transistors with the nominal oxide thickness of the integrated circuit. The decoupling capacitor, when not active in pumping charge into the power supply grid, behaves as a passive decoupling capacitor providing a degree of supply voltage smoothing.

In order to address voltage overshoots, the voltage regulating circuitry can be provided with an additional load device which is switched in so as to connect the first power rail and the second power rail when a voltage overshoot event is sensed.

Whilst the switching circuitry used in association with the capacitor could take a variety of different forms, it may conveniently be provided in the form of a first transistor coupling the second terminal to the third power rail and switched by the voltage difference sensing circuitry with a second transistor coupling the second terminal to the second power rail and also switched by the voltage difference sensing circuitry.

In a similar manner, the additional load device can take the form of a load transistor coupled between the first power supply rail and the second power supply rail and switched by the voltage difference sensing circuitry when an overshoot event is detected.

The voltage difference sensing circuitry could take a wide variety of different forms, such as an analogue circuit. However, power consumption and area advantages are associated with embodiments in which the voltage difference sensing circuit periodically samples the power supply voltage difference and determines for each sample if the power supply voltage difference is below the undershoot threshold level or above the overshoot threshold level.

The integrated circuit may be provided with voltage regulating circuitry comprising a plurality of said supply regulating capacitors each with respective switching circuitry and distributed across the integrated circuit. Providing the capacitors and switching circuitry in a distributed manner through the integrated circuit improves their speed of response and ability to cope with local voltage perturbations.

Viewed from another aspect the present invention provides an integrated circuit comprising:

processing means;

a first power supply means and a second power supply means respectively coupled to said processing circuitry for supplying electrical power at a power supply voltage difference to said processing means; and voltage regulating means coupled to said first power supply means and said second power supply means for regulating said power supply voltage difference; wherein said voltage regulating means comprises:

supply regulating capacitor means having a first terminal coupled to said first power supply rail and a second terminal;

switching means coupled to said second terminal, said second power supply means and a third power supply means so as to selectively couple said second terminal to one of said second power supply means and said third power supply means such that:
  (i) when said second terminal is coupled to said second power supply means, charge accumulates within said capacitor means; and,
  (ii) when said second terminal is coupled to said first power supply means, said charge accumulated within said capacitor means is supplied to said third power supply means; and voltage difference sensing means coupled to said first power supply means and said second power supply means for sensing said power supply voltage difference, said voltage difference sensing means being responsive to said power supply voltage difference falling below an undershoot threshold level to control said switching means to couple said second terminal to said third power supply means so as to regulate said power supply voltage difference against undershoot.

Viewed from a further aspect the present invention provides a method of regulating a power supply voltage difference being supplied to processing circuitry via a first power supply rail and a second power supply rail within an integrated circuit, said method comprising the steps of:

providing a supply regulating capacitor having a first terminal coupled to said first power supply rail and a second terminal;

selectively coupling said second terminal to one of said second power supply rail and a third power supply rail such that:
  (i) when said second terminal is coupled to said second power supply rail, charge accumulates within said capacitor; and,
  (ii) when said second terminal is coupled to said third power supply rail, said charge accumulated within said capacitor is supplied to said first power supply rail;
  sensing said power supply voltage difference; and
  in response to said power supply voltage difference falling below an undershoot threshold level, coupling said second terminal to said third power supply rail so as to regulate said power supply voltage difference against undershoot.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
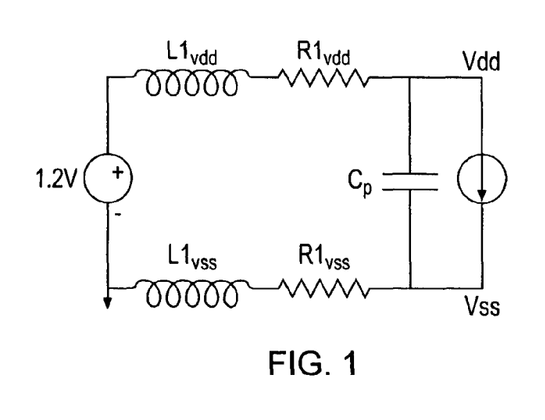
FIG. 1 schematically illustrates a simplified power distribution model for understanding the effects of inductive supply noise within an integrated circuit.
Figure 2:
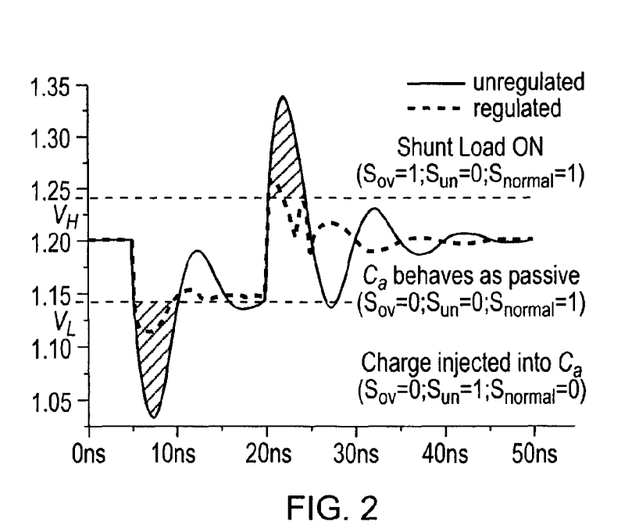
FIG. 2 illustrates a comparison between unregulated and regulated power supply voltage difference waveforms together with associated overshoot and understood threshold levels.
Figure 3:
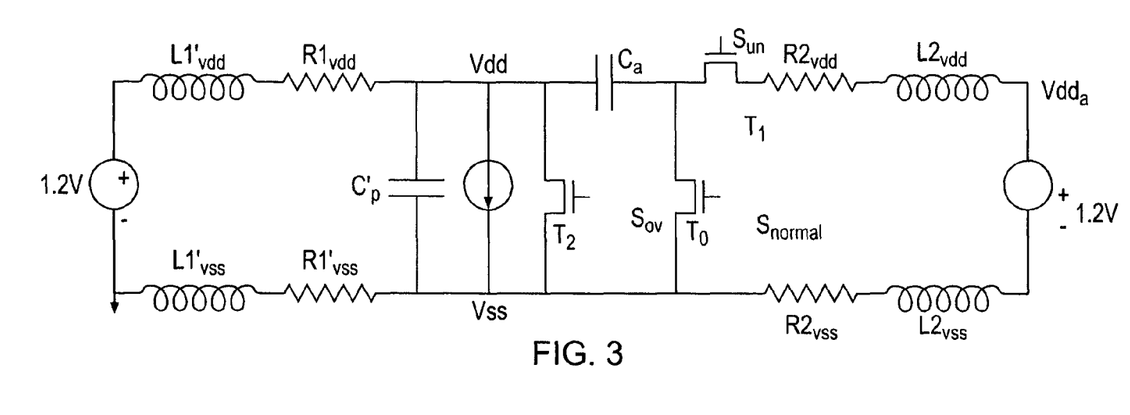
FIG. 3 schematically illustrates the voltage regulating circuitry according to one example embodiment of the present technique.

FIG. 1 shows the simplified model of a power delivery network to illustrate the present techniques. The plot of FIG. 2 shows a typical supply waveform when load (processing circuitry) is turned on and off. The shaded regions in the graph indicate regions where the supply voltage is outside the pre-specified margins, $V_H$ and $V_L$. FIG. 3 schematically illustrates the proposed active decoupling circuit. A fraction of the total pads within an integrated circuit available to the regular supply are allocated for $V_{dda}$. The total area of the passive decap (decoupling capacitors), Cp is reduced to incorporate $C_a$ (supply regulating capacitors) and the area overhead of the active voltage regulating control circuitry. $C_a$ is connected between $V_{dd}$ (first power supply rail) and $V_{ss}$ (second power supply rail) when the supply voltage is within safe (nominal) bounds. When the supply drops below the undershoot threshold $V_L$, transistor $T_1$ couples the negative terminal of $C_a$ to the $V_{dda}$ power rail and increases its potential from 0 to $V_{dda}$ thereby injecting a charge of $C_a V_{dda}$ into the power grid. An artificial load transistor (additional load device) $T_2$ is turned on to prevent excessive overshoots.

Figure 4:
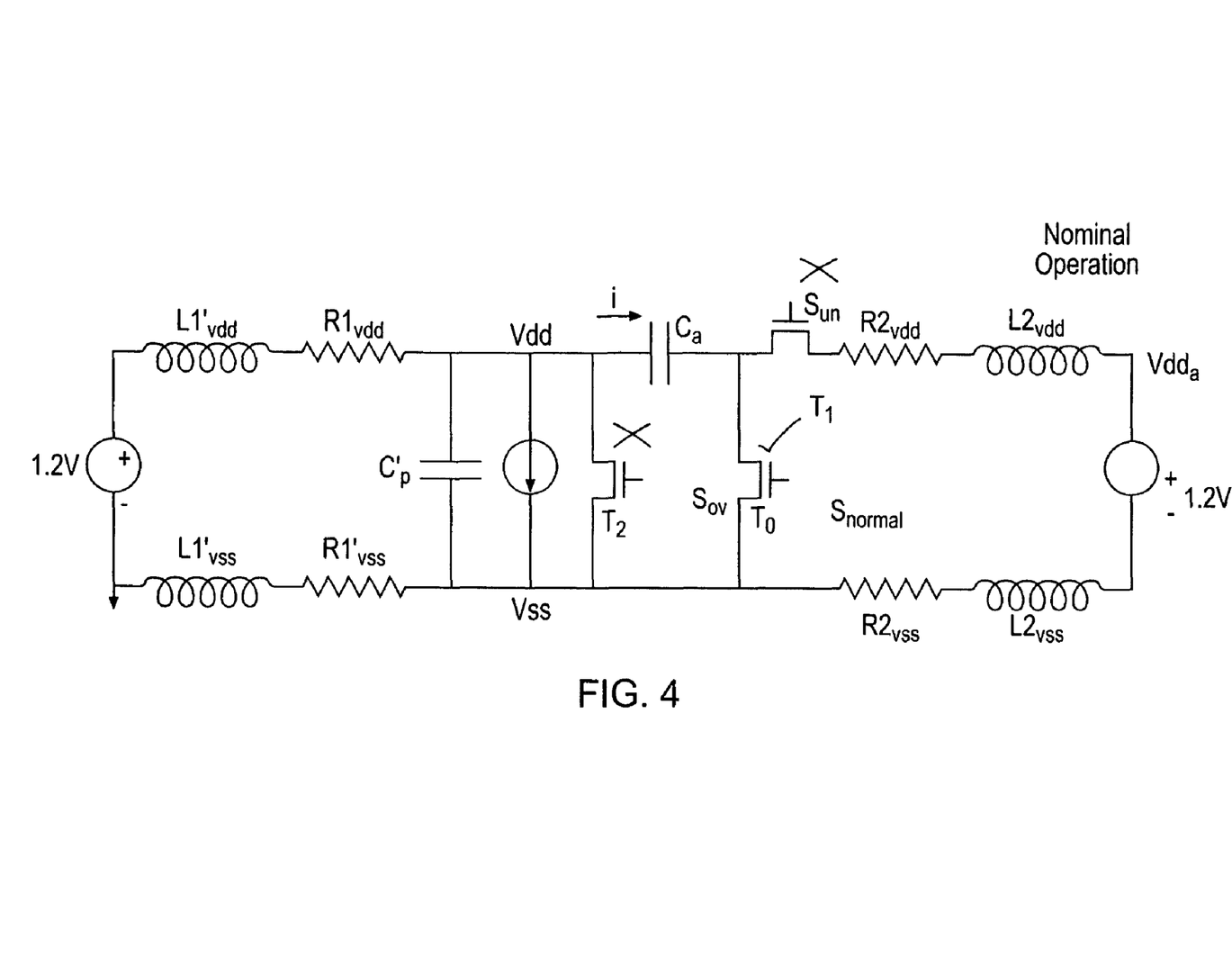
FIG. 4 illustrates nominal operation.

FIG. 4 illustrates nominal operation. In this nominal state the switching circuitry in the form of transistors $T_0$ and $T_1$ serves to connect the negative terminal of the supply regulating capacitor $C_a$ to the negative supply rail $V_{ss}$. Transistor $T_1$ is switched off and accordingly the negative terminal of the capacitor $C_a$ is not connected to the active power supply rail $V_{dda}$ (third power supply rail). In this nominal mode the capacitor $C_a$ acts to passively smooth inductive supply noise upon the power rail $V_{dd}$.

Figure 5:
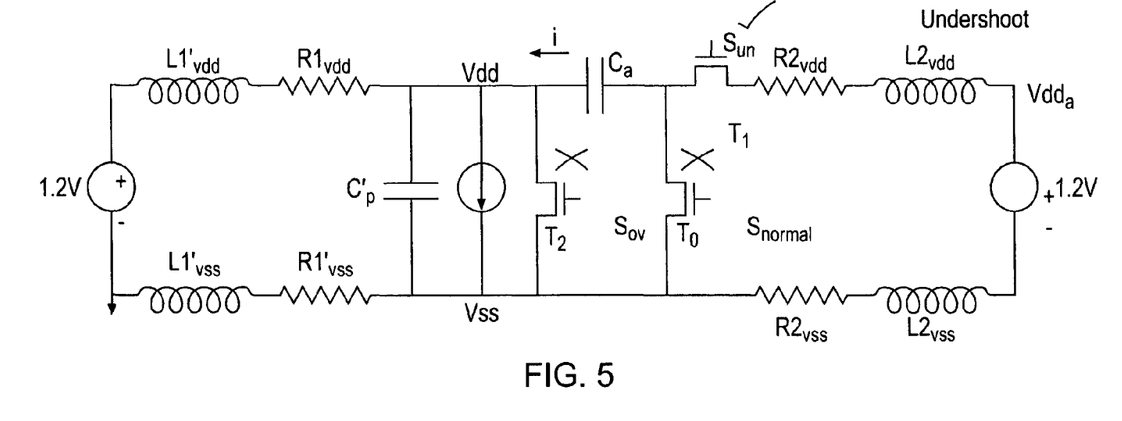
FIG. 5 illustrates undershoot operation.

FIG. 5 schematically illustrates operation during voltage undershoot. The voltage difference between the supply power rails $V_{dd}$ and $V_{ss}$ has been found to be less than a threshold voltage level $V_L$ and accordingly the transistor $T_1$ is switched on by a sensed undershoot signal $S_{un}$ from the voltage sensing circuitry (illustrated later). This serves to raise the potential at the negative terminal of the capacitor $C_a$ and accordingly the charge stored within this capacitor $C_a$ is pushed onto the supply rail $V_{dd}$. The sensed nominal $S_{normal}$ and sensed overshoot $S_{ov}$ signals respectively hold the transistors $T_0$ and $T_2$ switched off during this operation.

Figure 6:
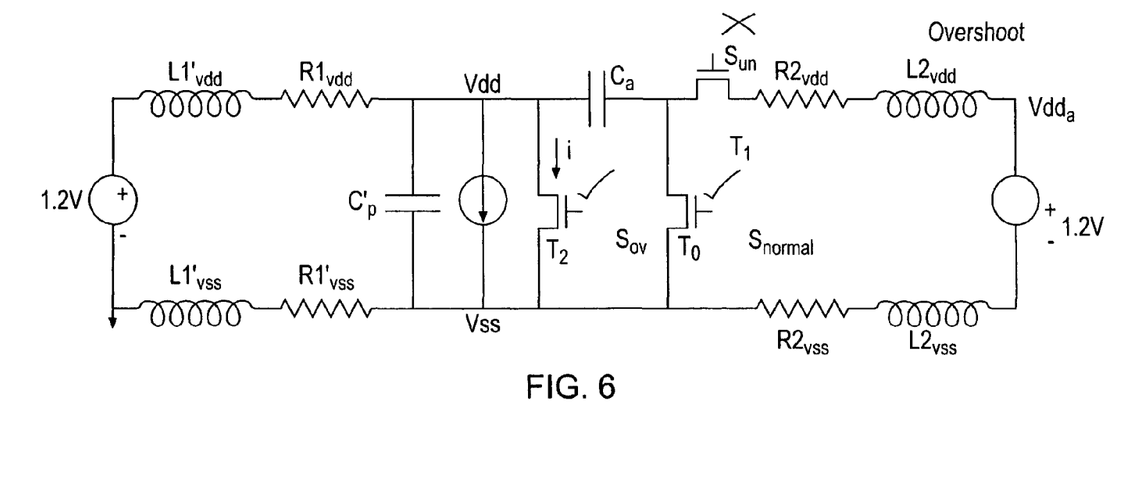
FIG. 6 illustrates overshoot operation.

FIG. 6 illustrates operation during an overshoot in the voltage on the supply rail $V_{dd}$. In this form of operation the transistor $T_1$ is switched off and transistor $T_0$ is switch on. $T_2$ is switched on by signal $S_{ov}$ so as to act as an additional load device. The additional load device $T_2$ serves to lower the potential on the supply rail $V_{dd}$. As will be seen from the above, the transistors $T_0$ and $T_1$ provide switching circuitry which selectively couples the negative terminal of the capacitor $C_a$ to either the third power supply rail $V_{dda}$ or the second power supply rail $V_{ss}$. It will be appreciated that the third power supply rail $V_{dda}$ could take the form of an isolatable section of the first power supply rail $V_{dd}$ or a separate power supply rail with its own power supply. The illustrated circuit has a separate power supply with the same voltage difference supplying the third power supply rail to the $V_{dda}$, but this could be the same power supply which supplies the first rail $V_{dd}$.

One of the important issues in overshoot/undershoot detection is speed. Analogue detection techniques are relatively slow or consume a large amount of quiescent current. A digital solution where two sets of clocked comparator banks (one each for undershoot and overshoot detection) can be used to sample supply waveforms at a high frequency (see FIGS. 7 to 11). A level-shifter (FIG. 7) first translates $V_{dd}$ and $V_{ss}$ waveforms to a common mode reference, $V_{ref}$ of 600 mV. $V_{ref}$ can be generated on-chip and any noise in $V_{ref}$ influences the common mode voltage only, making the differential sensing substantially immune to the noise. The translated waveforms, V+ and V− are differentially sensed by the two comparator banks (see FIGS. 10 and 11), each of which consists of 6 strongARM comparators. Transistors, $M_1$ and M, in each comparator (see FIG. 8) are skewed to create a switching threshold between V+ and V−. Calibration voltages $C_{l,un}$, $C_{r,un}$ ($C_{l,ov}$, $C_{r,ov}$) provide further post-silicon tuning of undershoot (overshoot) threshold, if required. A tuneable ring-oscillator based clock generator (see FIG. 9) is used to generate six phases (ø1-ø6) of a high-frequency (1 GHz-3.33 GHz) sampling clock. The six comparators in the undershoot and overshoot detectors sample V+ and V− with clocks (ø1-ø6) respectively, resulting in an effective sampling rate of up to 20 GSamples/sec. The outputs of the comparators are passed through an OR gate and a series of buffers to generate the control signals $S_{normal}$, $S_{ov}$ and $S_{un}$ which are used to control the circuitry of FIG. 3.

Figure 12:
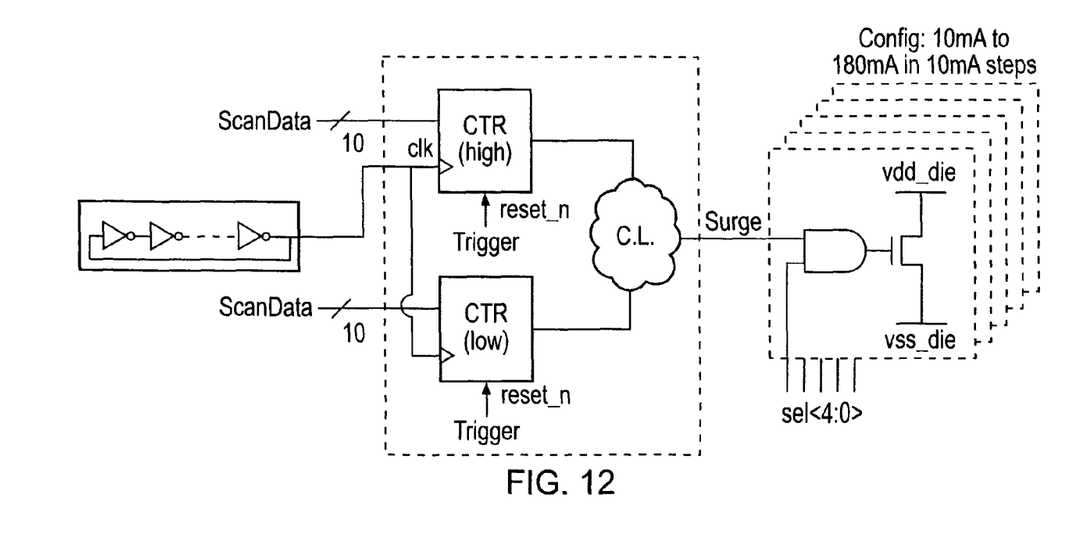
FIG. 12 illustrates a synthetic load-current generator used to test the effectiveness of the present technique.
Figure 13:
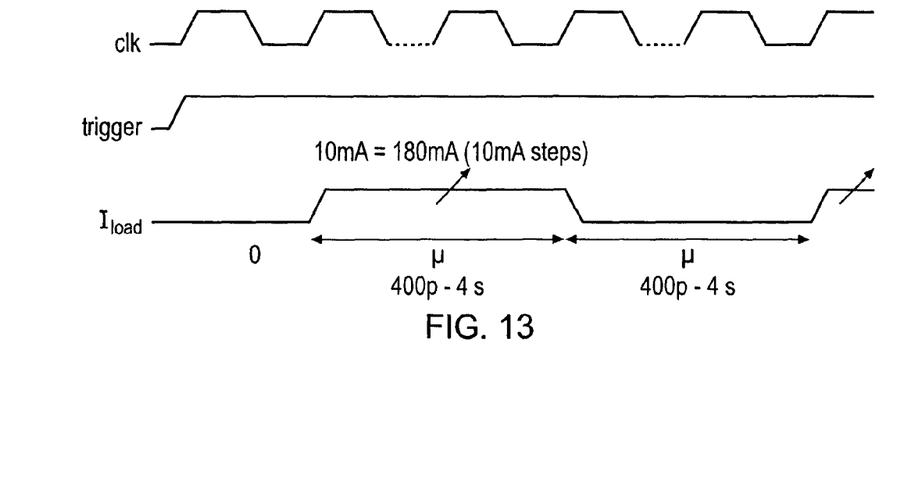
FIG. 13 illustrates control signals used in controlling the synthetic load-current generator of FIG. 12.
Figure 14:
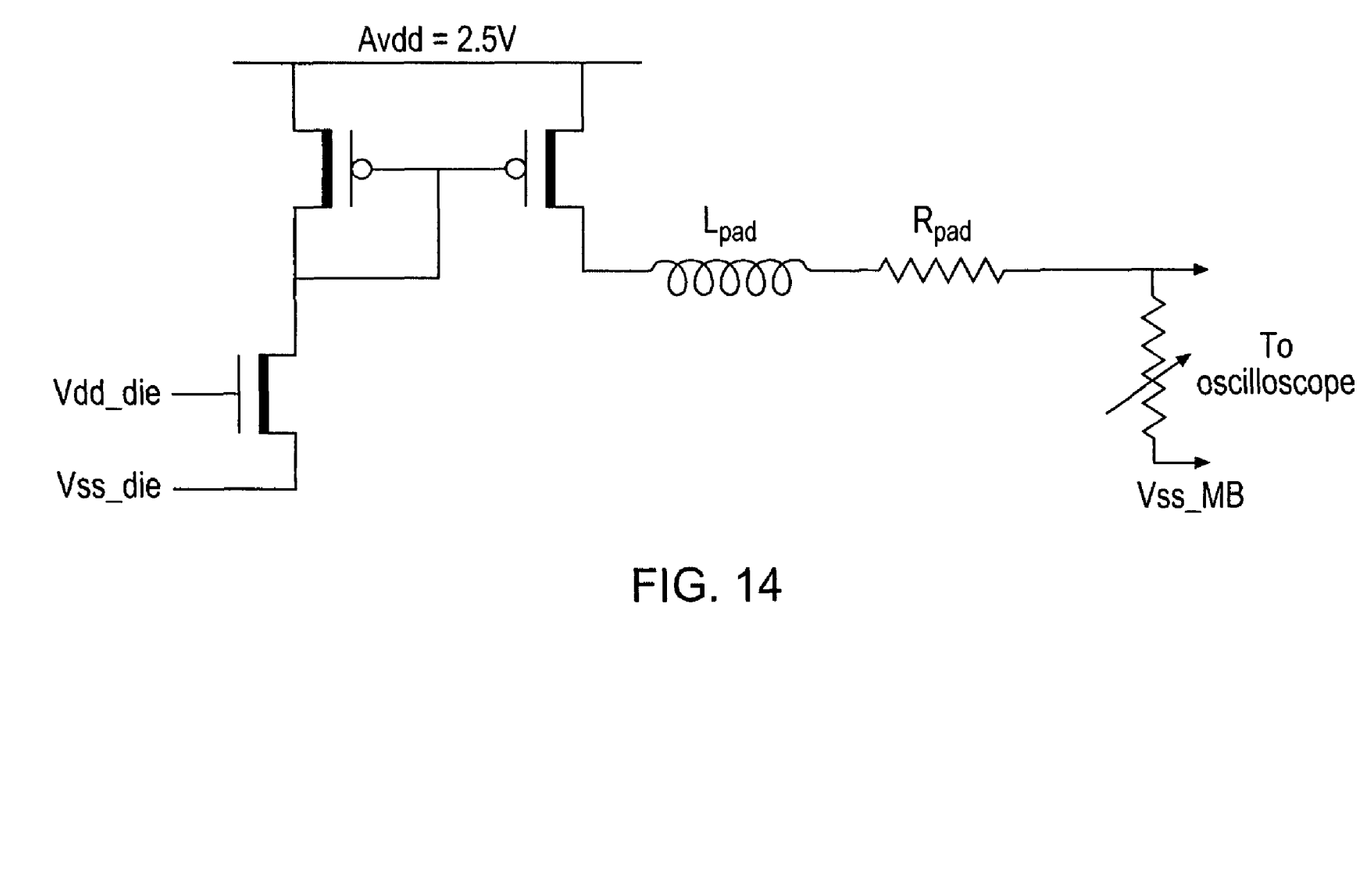
FIG. 14 illustrates a circuit for monitoring inductive supply noise for testing the effectiveness of the present technique.
Figure 20:
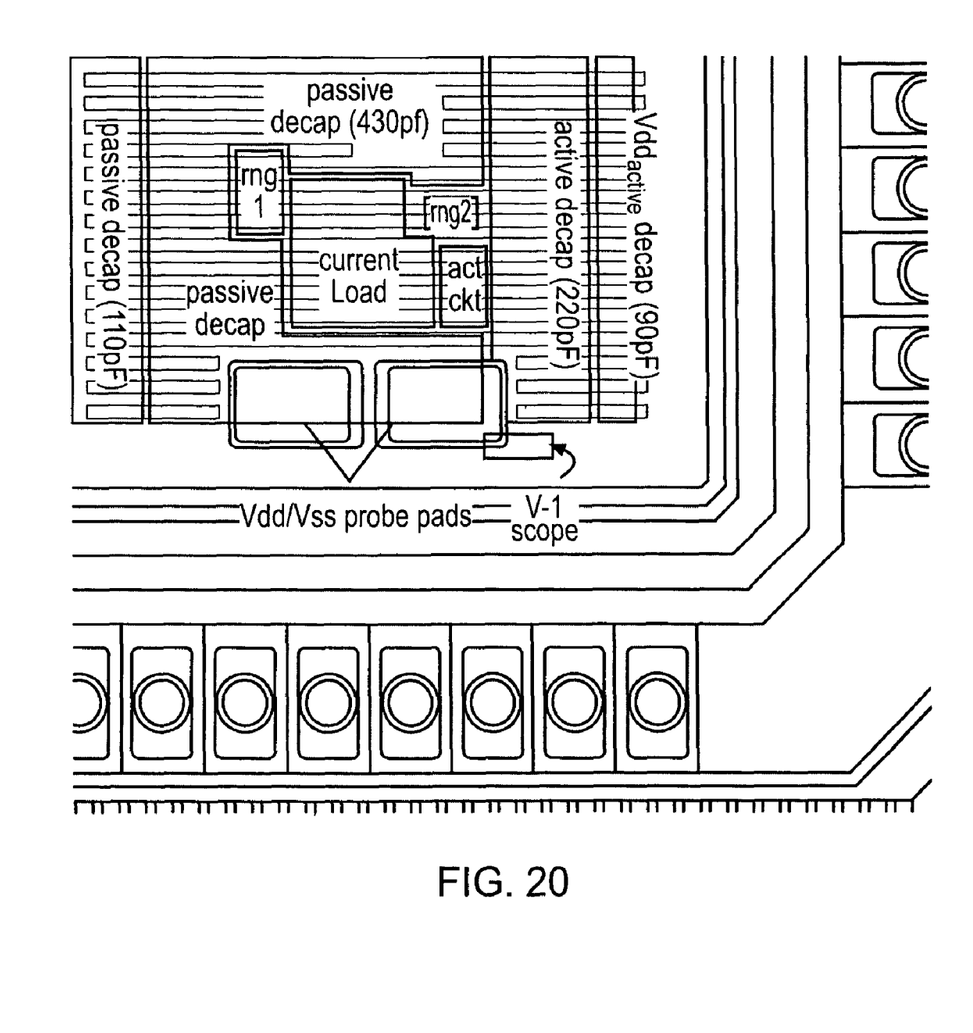
FIG. 20 is a die micrograph of a test die used for generating the preceding example results.

A configurable load-current generator (see FIGS. 12 and 13), with tuneable duty cycle, frequency and peak amplitude is provided using an array of variable width transistors connected between $V_{dd}$ and $V_{ss}$ for the purpose of simulating the action of processing circuitry and testing the regulating effectiveness of the present techniques. The peak amplitude is variable from 10 mA to 120 mA. The low period and the high period of the periodic load current are independently tuneable from 500 ps to 2 µs. A V-I converter-based drop detector circuit [Nagata et al., "A built-in technique for probing power supply and ground noise distribution within large-scale digital integrated circuits," IEEE J. Solid-State Circuits, vol. 40. no. 4, pp. 813-819, April 2005] is implemented to measure the high frequency supply noise (see FIG. 14). The test-chip of FIG. 20 is provided with probe pads to measure the supply noise.

Figures 7, 8, 9, 10, 11:
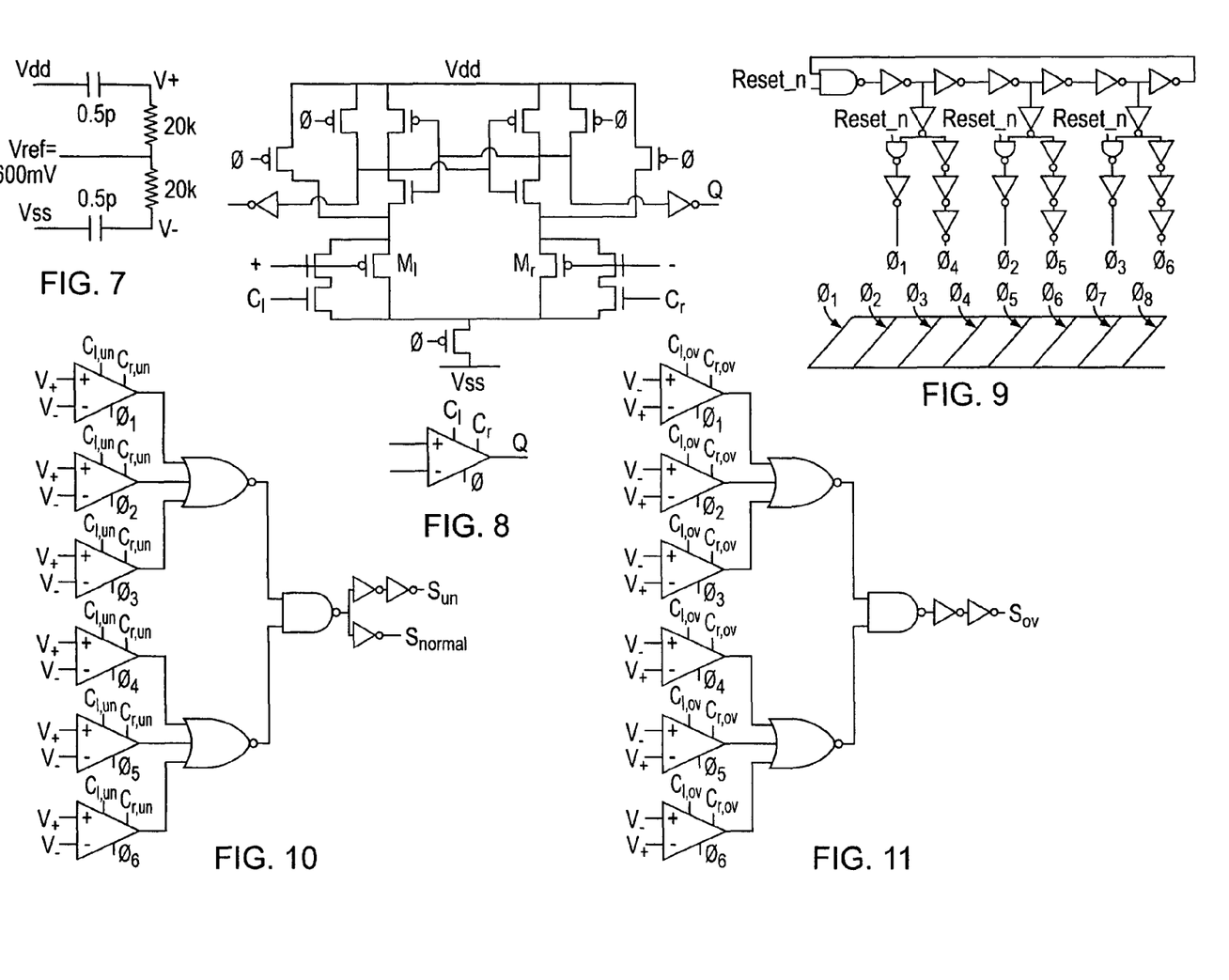
FIG. 7 illustrates a level shifter.
FIG. 8 illustrates a comparator and its symbolic representation.
FIG. 9 illustrates a circuit for sampling clock generation.
FIG. 10 illustrates an undershoot detector within the voltage difference sensing circuitry.
FIG. 11 illustrates an overshoot detector within the voltage difference sensing circuitry.

The test-chip (see FIG. 20) was fabricated in a 0.13 µm, 8-metal, 1.2V triple-well process. The unregulated and regulated test cases were implemented for an iso-area, iso-pad comparison. The unregulated case utilized three $V_{dd}$ pads, three $V_{ss}$ pads and 760 pF of passive decap. For the regulated case, one pad was allocated for $V_{dda}$ resulting in two $V_{dd}$ and three $V_{ss}$ pads. Although the regular supply is isolated from the active supply in normal conditions, a small amount of decap was allocated for $V_{dda}$ to prevent excessive ringing. $C_p$, $C_a$ and decap for the active supply were 430 pF, 220 pF and 90 pf respectively for the regulated case. The area overhead of the active circuit, which includes the sampling clock generator, undershoot/overshoot detectors and switches $T_0$, $T_1$ and $T_2$, was equivalent to the area of 10 pF decap or approximately 1.54% of the total decap area. The power overhead of the active circuit was measured to be less than 1% of the peak power consumption of 48 mW. FIG. 11 shows the measurement setup of the prototype.

Figure 15:
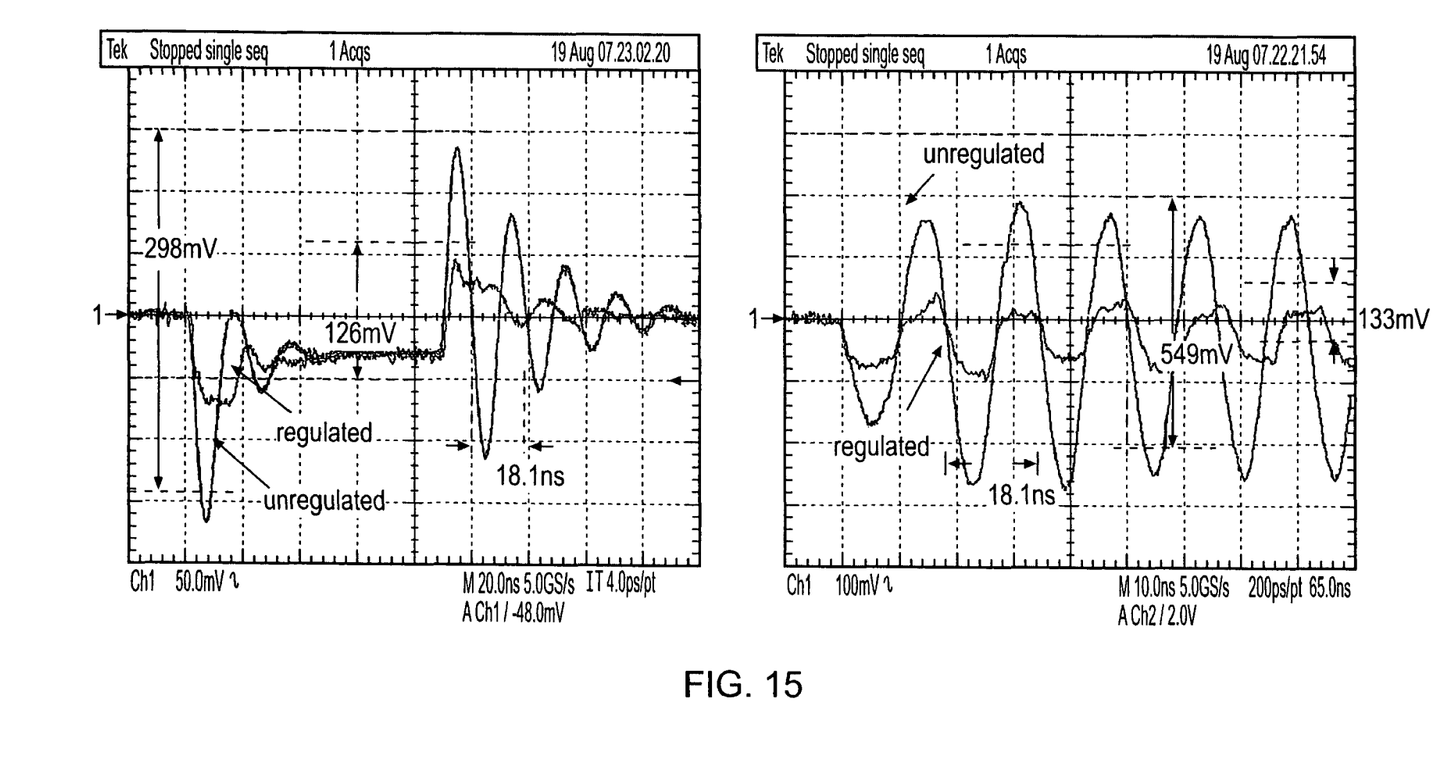
FIG. 15 illustrates a comparison of measured regulated and unregulated waveforms when load current is ramped from low to high and high to low (as well as during resonance)
Figure 16:
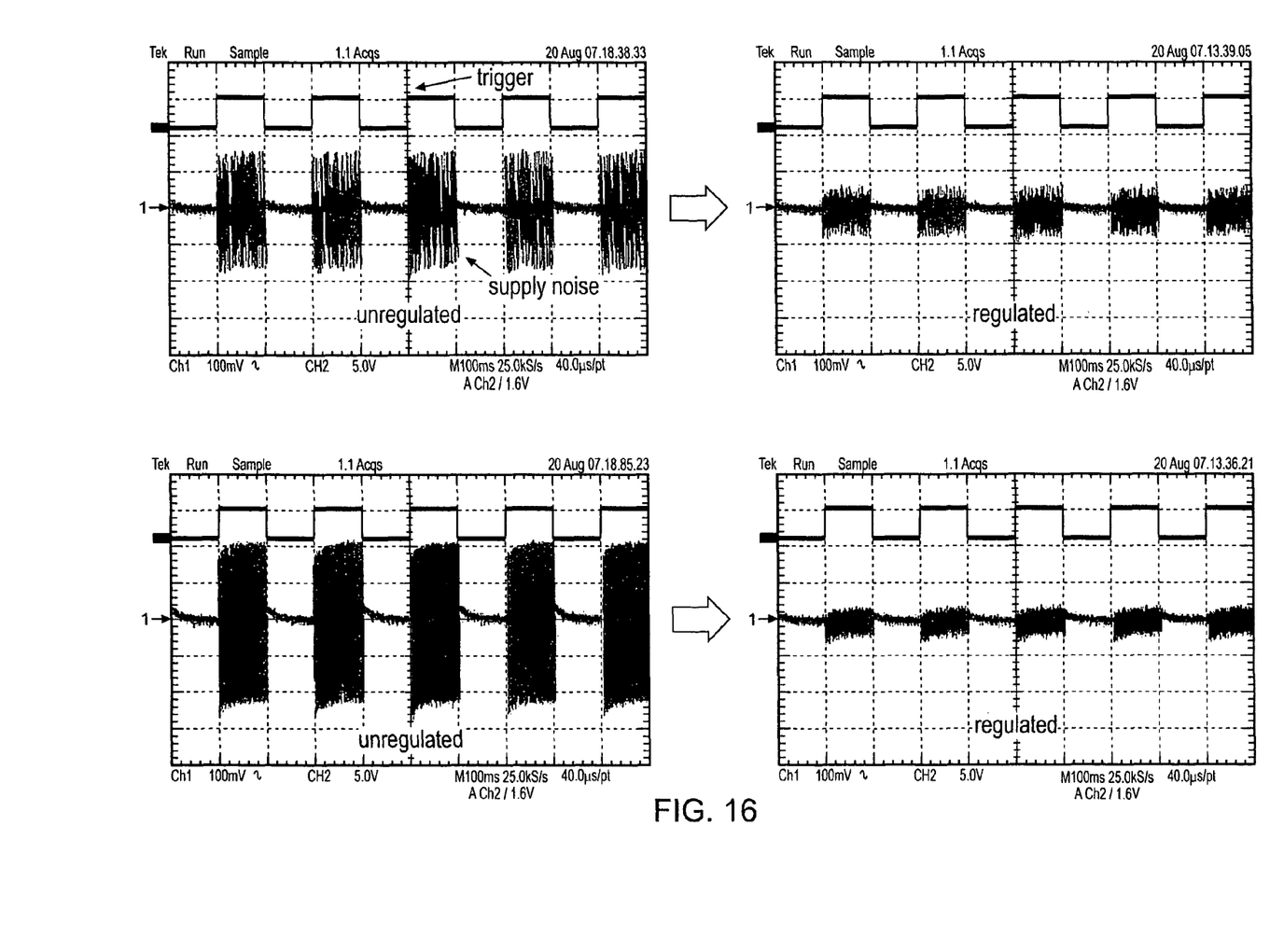
FIG. 16 illustrates measured regulated and unregulated inductive supply noise.

FIG. 15 shows a comparison of the measured on-die supply waveforms with and without active supply regulation for one die. In FIG. 15 (left), the excitation load-current ramps up from 0 to 40 mA and back. This is representative of the wake-up and turn-off of a power-gated or a clock-gated module. Active regulation reduces the peak-to-peak supply drop from 298 mV to 126 mV, an improvement of 57%. The steady-state IR-drop remains the same in regulated and unregulated cases. During resonance (FIG. 15 (right)), the peak-to-peak supply fluctuation reduces from 549 mV to 133 mV, an improvement of 75%. FIG. 16 shows a zoomed-out version of the supply noise waveforms for the two scenarios.

Figure 17:
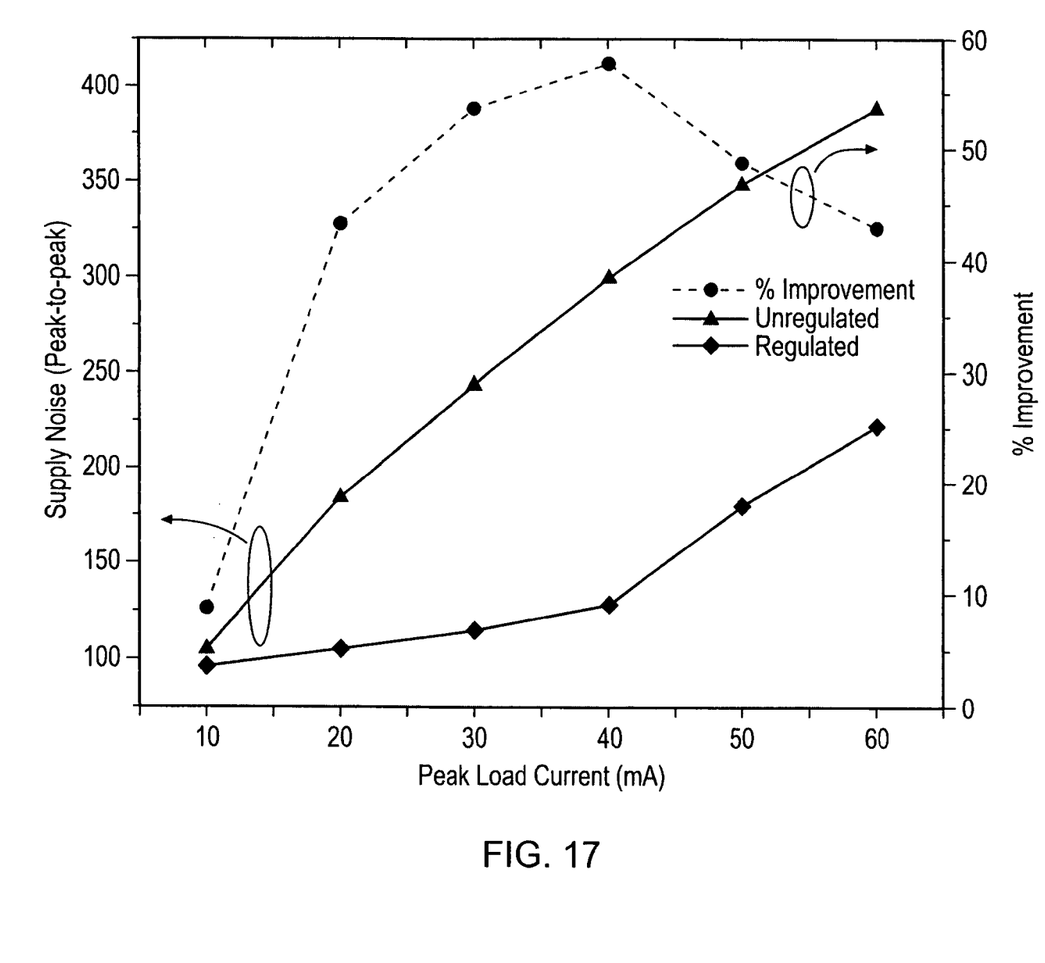
FIG. 17 illustrates the measured variation of unregulated and regulated supply voltage difference drop with peak load current, as well as the percentage variation therein.
Figure 18:
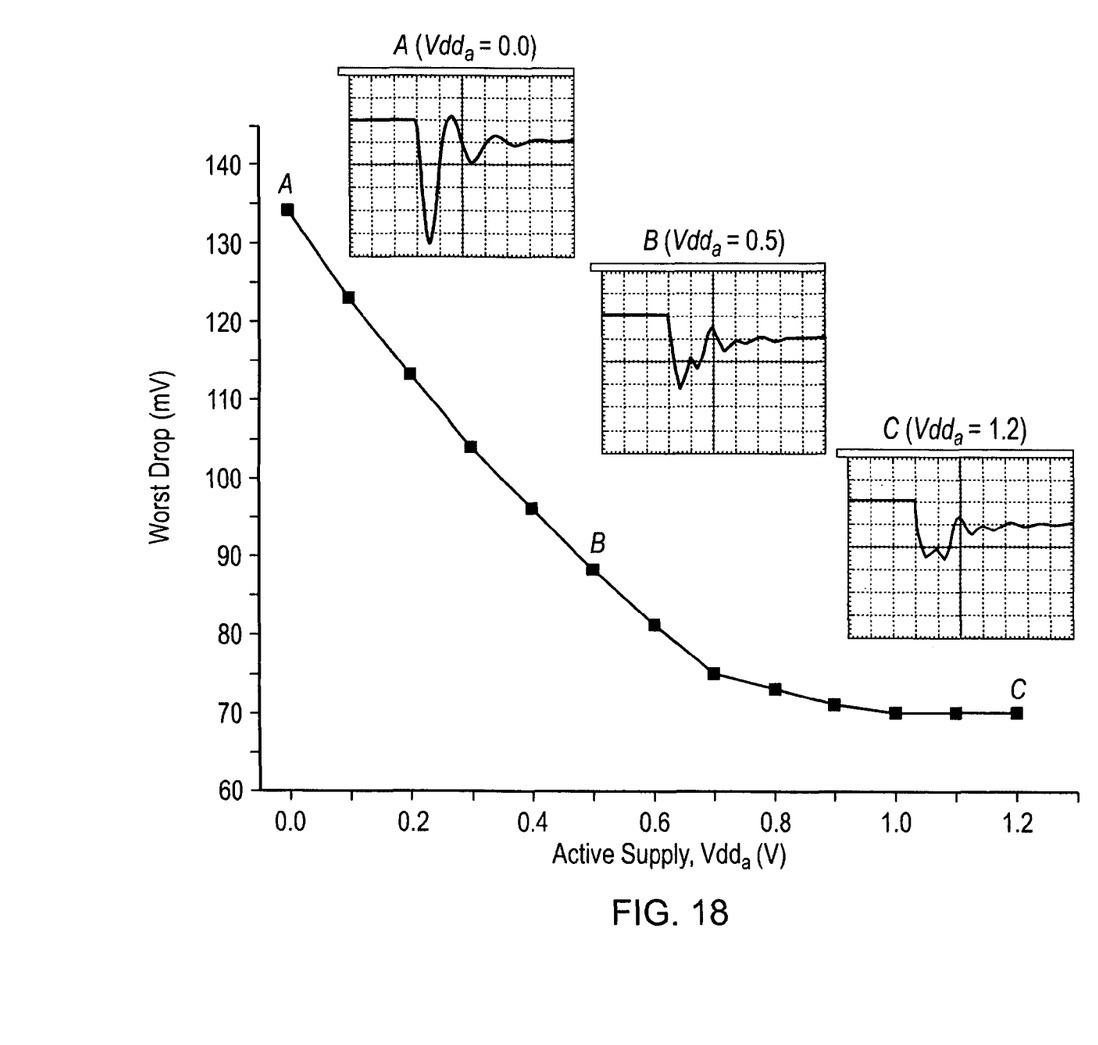
FIG. 18 illustrates the measured variation of worst-case regulated power supply drop with the supply voltage used by the active regulation circuitry.

FIG. 17 plots the measured worst drop and improvement as a function of peak load-current for one die. At high loads, the charge injected through the active decap gets limited by the size of $C_a$ and $T_1$. The largest improvement of 57.7% was measured for the peak current of 40 mA. FIG. 18 shows the measured worst regulated drop as a function of $V_{dda}$. The regulated supply exhibits a second dip immediately after the first one for cases B($V_{dda}$=0.5V) and C($V_{dda}$=1.2V), which is attributed to the recharging of $C_a$ once $V_{dd}$ is above $V_L$ to $T_0$ turns on. The injected charge increases with $V_{dda}$, resulting in a reduction in the first dip. As $V_{dda}$ is increased above 1.2V, the second dip becomes more prominent, thus worsening the worst-case drop.

Figure 19:
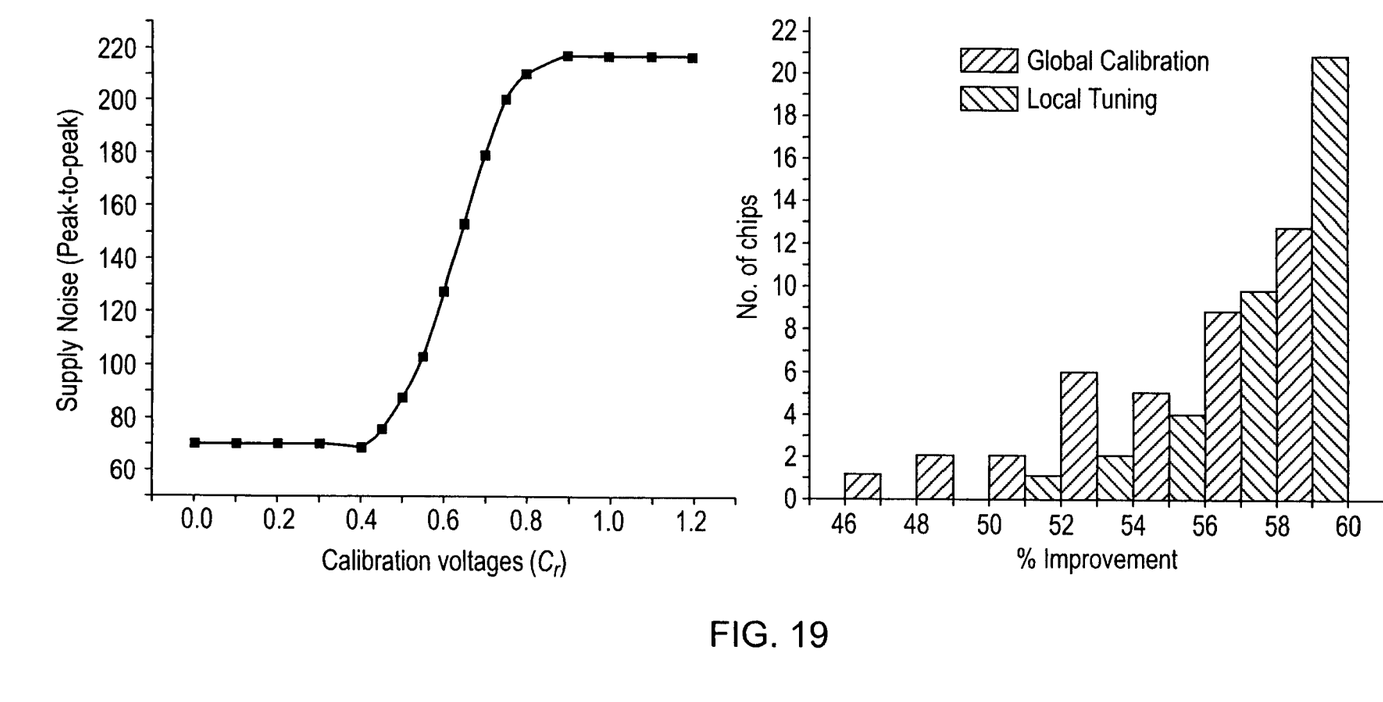
FIG. 19 illustrates the measured variation of worst-case peak-to-peak regulated supply voltage drop during resonance with variation in the undershoot and overshoot calibration voltages together with a histogram showing the percentage improvement in worst-case supply voltage difference drop for a pulse current load with global calibration voltages and with local calibration tuning for individual dies.

FIG. 19 (left) shows the peak-peak supply noise during resonance when $C_{r,un}$=$C_{r,ov}$=$C_r$ is varied from 0 to 1.2V and $C_{l,un}$=$C_{l,ov}$=). An increase in $C_r$ increases $V_H$ and $V_L$, increasing the regulated drop. A statistical analysis (FIG. 19) was performed on third eight chips for step current-loads, to evaluate the effect of a simplified global calibration for all chips as opposed to tuning of each die. The min, max and avg improvements for global calibration were 47.1%, 59.6% and 55.9% respectively. When each die is tuned for its best calibration, the min, max and avg improvements were 51%, 59.7% and 57.6% respectively, which indicate only a marginal improvement over global calibration.

Figure 21:
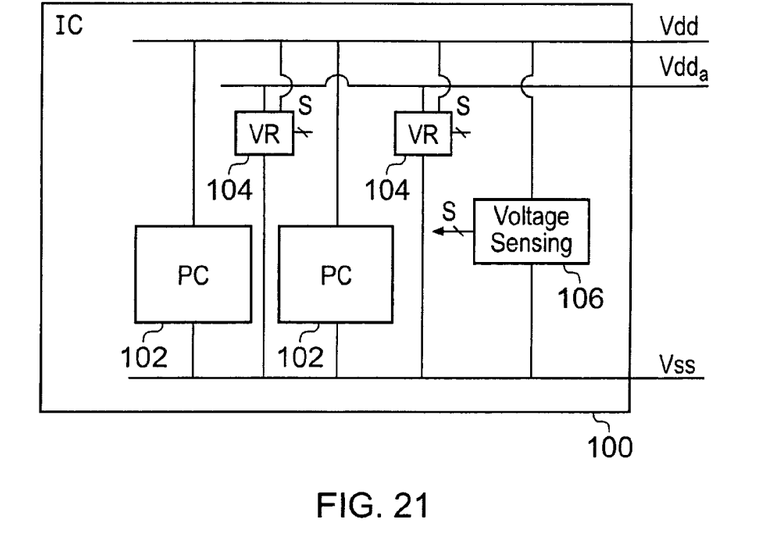
FIG. 21 schematically illustrates an integrated circuit employing processing circuitry having respective local voltage regulating circuitry using the present techniques.

FIG. 21 schematically illustrates an integrated circuit 100 including a plurality of blocks of processing circuitry 102 supplied with a voltage difference using a first power rail $V_{dd}$ and a second power rail $V_{ss}$. Also provided in association with each of the blocks of processing circuitry 102, or at least in a manner distributed through the integrated circuit 100, are a plurality of voltage regulating circuit blocks 104. These voltage regulating circuit blocks 104 are supplied with an active power supply via the second power rail $V_{ss}$ and a third power rail $V_{dda}$. The voltage regulating blocks 104 include voltage regulating capacitors which accumulate charge during normal operation and serve to dump that charge onto the first power rail $V_{dd}$ should a voltage undershoot occur. The voltage regulating blocks 104 also include active additional load elements/devices which are connected between the first power rail $V_{dd}$ and the second power rail $V_{ss}$ should a voltage overshoot arise. Voltage sensing circuitry 106 is coupled between the first power rail $V_{dd}$ and the second power rail $V_{ss}$ in order to sense voltage undershoots and overshoots. The voltage sensing circuitry 106 provides control signals S which are supplied to the respective voltage regulating blocks 104 to switch them between the undershoot, overshoot and nominal modes of operation.

Figure 22:
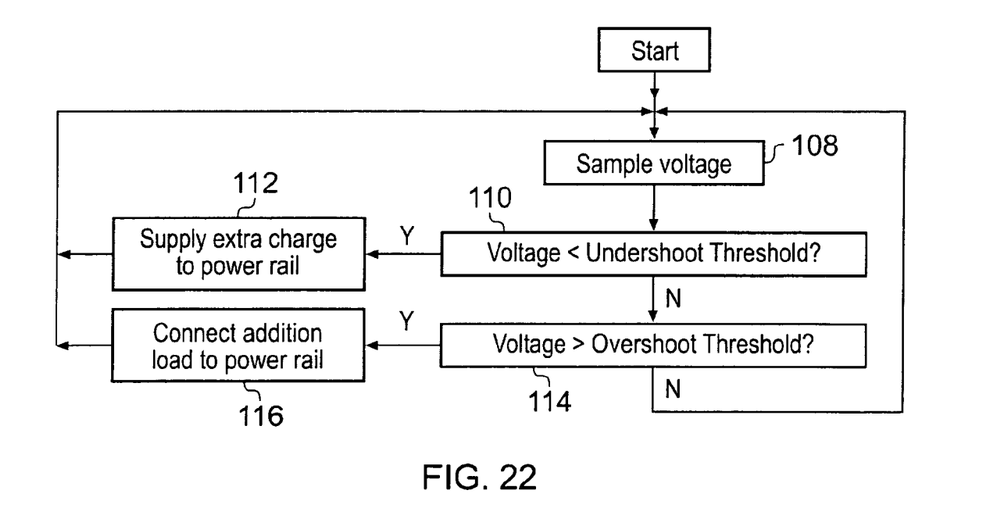
FIG. 22 is a flow diagram schematically illustrating the operation of the voltage regulating circuitry of the present technique.

FIG. 22 is a flow diagram schematically illustrating operation of the current technique. At step 108 the voltage difference between the first power rail $V_{dd}$ and the second power rail $V_{ss}$ is sampled. If this voltage difference is less than an undershoot threshold level, then this is detected at level 110 and step 112 serves to supply extra charge to the first power rail $V_{dd}$ from the voltage regulating capacitor $C_a$. If there is no voltage undershoot, then processing proceeds to step 114 at which a determination is made as to whether or not there is a voltage overshoot. If there is a voltage overshoot then step 116 serves to connect the additional load in the form of transistor $T_2$ between the first power rail $V_{dd}$ and $V_{ss}$ so as to lower the potential difference of the power supply.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   processing circuitry;
   a first power supply rail and a second power supply rail respectively coupled to said processing circuitry, electrical power at a power supply voltage difference being supplied to said processing circuitry via said first power supply rail and said second power supply rail; and
   voltage regulating circuitry, coupled to said first power supply rail and said second power supply rail, configured to regulate said power supply voltage difference, wherein said voltage regulating circuitry comprises:
      a supply regulating capacitor having a first terminal coupled to said first power supply rail and a second terminal;
      switching circuitry, coupled to said second terminal, said second power supply rail and a third power supply rail, configured to selectively couple said second terminal to one of said second power supply rail and said third power supply rail such that:
         (i) when said second terminal is coupled to said second power supply rail, charge accumulates within said capacitor; and,
         (ii) when said second terminal is coupled to said third power supply rail, said charge accumulated within said capacitor is supplied to said first power supply rail; and
      voltage difference sensing circuitry, coupled to said first power supply rail and said second power supply rail, configured to sense said power supply voltage difference, said voltage difference sensing circuitry, responsive to said power supply voltage difference falling below an undershoot threshold level, configured to control said switching circuitry to couple said second terminal to said third power supply rail so as to regulate said power supply voltage difference against undershoot.

2. An integrated circuit as claimed in claim 1, wherein said voltage regulating circuitry comprises an additional load device coupling said first power rail to said second power rail, said voltage difference sensing circuitry being responsive to said power supply voltage difference rising above an overshoot threshold level to switch said additional load device to provide a conduction path between said first power supply rail and said second power supply rail so as to regulate said power supply voltage difference against overshoot.

3. An integrated circuit as claimed in claim 1, wherein said switching circuitry comprises a first transistor coupling said second terminal to said third power rail and switched by said voltage difference sensing circuitry and a second transistor coupling said second terminal to said second power rail and switched by said voltage difference sensing circuitry.

4. An integrated circuit as claimed in claim 1, wherein said voltage difference sensing circuitry periodically samples said power supply voltage difference and determines for each sample if said power supply voltage difference is below said undershoot threshold level.

5. An integrated circuit as claimed in claim 1, wherein said voltage regulating circuitry comprises a plurality of said voltage regulating capacitors each with respective switching circuitry and distributed within said integrated circuit.

6. An integrated circuit as claimed in claim 1, wherein when said second terminal is coupled to one of said second power supply rail and said third power supply rail, said second terminal is not coupled to the other of said second power supply rail and said third power supply rail.

7. An integrated circuit as claimed in claim 2, wherein said additional load device comprises a load transistor coupled between said first power supply rail and said second power supply rail and switched by said voltage difference sensing circuitry.

8. An integrated circuit as claimed in claim 2, wherein said voltage difference sensing circuitry periodically samples said power supply voltage difference and determines for each sample if said power supply voltage difference is above said overshoot threshold level.

9. An integrated circuit comprising:
   processing circuitry;
   a first power supply means and a second power supply means, respectively coupled to said processing circuitry, for supplying electrical power at a power supply voltage difference to said processing circuitry; and
   voltage regulating means, coupled to said first power supply means and said second power supply means, for regulating said power supply voltage difference, wherein said voltage regulating means comprises:
      supply regulating capacitor having a first terminal coupled to said first power supply rail and a second terminal;
      switching means, coupled to said second terminal, said second power supply means and a third power supply means for supplying electrical power, for selectively coupling said second terminal to one of said second power supply means and said third power supply means such that:

(i) when said second terminal is coupled to said second power supply means, charge accumulates within said capacitor; and,
(ii) when said second terminal is coupled to said first power supply means, said charge accumulated within said capacitor is supplied to said third power supply means; and voltage difference sensing means, coupled to said first power supply means and said second power supply means, for sensing said power supply voltage difference, said voltage difference sensing means, responsive to said power supply voltage difference falling below an undershoot threshold level, for controlling said switching means to couple said second terminal to said third power supply means so as to regulate said power supply voltage difference against undershoot.

* * * * *